(12) United States Patent
Martin

(10) Patent No.: US 7,327,143 B2
(45) Date of Patent: Feb. 5, 2008

(54) MINIATURIZED DETECTION COIL FORMER FOR NMR SPECTROSCOPY

(75) Inventor: Alfred Martin, Munich (DE)

(73) Assignee: Infineon Technologies AG, Neubiberg (DE)

( * ) Notice: Subject to any disclaimer, the term of this patent is extended or adjusted under 35 U.S.C. 154(b) by 118 days.

(21) Appl. No.: 11/361,708

(22) Filed: Feb. 24, 2006

(65) Prior Publication Data

US 2006/0261814 A1 Nov. 23, 2006

(30) Foreign Application Priority Data

Feb. 25, 2005 (DE) .................. 10 2005 008 798

(51) Int. Cl.
- *G01V 3/00* (2006.01)
- *H01P 7/04* (2006.01)
- *H01Q 1/42* (2006.01)
- *H01Q 1/40* (2006.01)

(52) U.S. Cl. ............... 324/318; 333/222; 343/872; 343/873

(58) Field of Classification Search ........ 324/300–322; 600/410–435; 333/219–235; 343/824–835, 343/841–842, 872–873

See application file for complete search history.

(56) References Cited

U.S. PATENT DOCUMENTS

| | | | | |
|---|---|---|---|---|
| 6,194,900 | B1 * | 2/2001 | Freeman et al. | 324/321 |
| 6,272,370 | B1 * | 8/2001 | Gillies et al. | 600/411 |
| 6,504,224 | B1 * | 1/2003 | Ahn et al. | 257/508 |
| 6,541,859 | B1 * | 4/2003 | Forbes et al. | 257/742 |
| 6,879,017 | B2 * | 4/2005 | Ahn et al. | 257/508 |
| 7,048,716 | B1 * | 5/2006 | Kucharczyk et al. | 604/164.01 |
| 7,186,664 | B2 * | 3/2007 | Ahn et al. | 438/770 |
| 2002/0068369 | A1 | 6/2002 | Scherer et al. | |

OTHER PUBLICATIONS

M. Lindeberg, et al. "Interconnected nanowire clusters in polyimide for flexible circuits and magnetic sensing applications," Sensors and Actuators A 105, (2003), pp. 150-161.

Jun-Bo Yoon, et al., "High-Performance Electroplated Solenoid-Type Integrated Inductor ($SI^2$) For RF Applications Using Simple 3D Surface Micromachining Technology," Electron Devices Meeting 1998, IEDM '98 Technical Digest, (199), pp. 544-547.

R.L. Magin, et al., "Miniature magnetic resonance machines," IEEE Spectrum, IEEE Inc., New York, (1997), pp. 51-61.

H. Wensink et al., "Measuring reaction kinetics in a lab-on-a-chip by microcoil NMR," Lab Chip, (2005), pp. 280-284.

H. Foll et al., "Formation and application of porous silicon," Materials Science and Engineering R: Reports, (2002), pp. 93-141.

* cited by examiner

*Primary Examiner*—Brij Shrivastav
*Assistant Examiner*—Dixomara Vargas
(74) *Attorney, Agent, or Firm*—Dickstein Shapiro LLP

(57) ABSTRACT

One exemplary miniaturized detection coil former for NMR spectroscopy includes a macroporous carrier material having a first surface and a second surface situated opposite thereto, as well as a multiplicity of discrete pores formed in the carrier material and having a diameter in the range of 500 nm to 100 μm being arranged in a manner distributed over at least one surface region. The pores extend through the carrier material from the first to the second surface. A radiofrequency microcoil is embedded in the macroporous carrier material. The detection coil former finds particular utility in an NMR overall analysis system for the NMR-spectroscopic analysis of chemical compounds in the liquid phase.

13 Claims, 3 Drawing Sheets

MINIATURIZED DETECTION COIL FORMER FOR NMR SPECTROSCOPY

CROSS REFERENCE TO RELATED APPLICATION

The present application claims priority to German patent application Serial No. 10 2005 008 798.1, filed Feb. 25, 2005, which is hereby expressly incorporated by reference in its entirety.

TECHNICAL FIELD

The present invention relates to a miniaturized detection coil former for NMR spectroscopy, including a macroporous carrier material having a first surface and a second surface situated opposite thereto, and a multiplicity of discrete pores having a diameter in the range of 500 nm to 100 µm being arranged in a manner distributed over at least one surface region. The pores extend through the carrier material from the first to the second surface, and a radiofrequency microcoil is embedded in the macroporous carrier material. Furthermore, the present invention relates to methods for producing the detection coil former according to the invention and also the use of the detection coil former in an NMR overall analysis system for the NMR-spectroscopic analysis of chemical compounds in the liquid phase.

BACKGROUND

Nuclear magnetic resonance spectroscopy, also referred to as NMR spectroscopy, is one of the most important and most meaningful methods for elucidating the structure of molecules. The investigations are predominantly effected in a condensed phase, that is to say in solution or in the solid state. The advantage of this method over other methods is that it is possible to obtain statements about the structure of molecules even in multicomponent systems, without requiring a priori knowledge of the constituents. For elucidating the structure of chemical compounds, use is often also made of combined methods, that is to say methods in which firstly a multicomponent system is separated into the individual components before the individual components are then analyzed separately. One example of such an integrated system is gas chromatography mass spectroscopy (GC-MS), by means of which substances can be detected and analyzed even in the nanograms range. However, mass spectroscopy yields only limited information about the structure of a chemical compound. Moreover, this method has the disadvantage that the sample is destroyed by the investigation, which is problematic precisely in the case of samples which are particularly valuable or are present only in extremely small amounts. NMR spectroscopy does not have this disadvantage, by contrast, since the sample is not destroyed during the NMR-spectroscopic investigation. Therefore, analysis methods are desirable in which a separation system, such as, for example, capillary electrophoresis or liquid chromatography, is combined with NMR spectroscopy in an integrated system.

However, the inherent insensitivity of the NMR method has limited its usability as a detection method, for a liquid phase analysis of very small samples. Thus, only microgram amounts of a substance can be routinely examined with commercially available NMR spectrometers, small sample tubes having a diameter of 5 mm and a solution volume of approximately 500 µl being used in such an application. Amounts in the micrograms range, on the other hand, can only be examined in extremely lengthy measurements and with diminished small sample tubes (1 mm) and solution volume (1 µl). Even smaller sample volumes are difficult to realize, however, which impedes an application in conjunction with capillary electrophoresis or liquid chromatography. Such a method would be desirable, however, precisely with regard to chemical synthesis and biotechnology, which require an efficient analysis of samples in the high throughput range.

The problem of the low sensitivity can be solved, however, by the use of miniaturized detection coils in the NMR measuring device. By means of smaller coils, it is possible to significantly improve the sensitivity compared with conventional coils. A critical quantity in the assessment of the sensitivity of a measurement is the signal/noise ratio (S/N). The latter is proportional to the sample volume $V_P$ and to the strength of the radiofrequency field $B_1$. Moreover, S/N is inversely proportional to the root of the resistance of the detection coil R. Since R is proportional to the coil radius $r_s$, the following holds true:

$$S/N \sim V_P \cdot B_1 / r_s^{1/2}$$

Consequently, the signal/noise ratio can be maximized by reducing the coil diameter. In order, however, to obtain a satisfactory signal in the case of a reduced coil radius, the coil internal diameter would have to be matched as well as possible to the sample size.

DE 199 27 976 A1, which is hereby incorporated by reference in its entirety, describes, for a use in a liquid phase analysis, a miniaturized overall analysis system having an NMR detection compartment around which an RF microcoil is situated. However, when using the arrangement described in DE 199 27 976 A1, the correspondence between the size of the sample and the size of the NMR detection coil is not optimal, as a result of which the sensitivity of the NMR-spectroscopic measurement is restricted.

SUMMARY

In view of the preceding, the present invention is based on the object of providing an NMR measuring device which permits measurement even of extremely small sample amounts, in particular including those of less than 1 µl, in which case, however, a satisfactory signal intensity is nevertheless intended to be achieved due to the construction of the present invention.

In particular, a miniaturized detection coil former for NMR spectroscopy according to one embodiment includes a macroporous carrier material having a first surface and a second surface situated opposite thereto, as well as a multiplicity of discrete pores having a diameter in the range of 500 nm to 100 µm and being arranged in a manner distributed over at least one surface region. The pores extend through the carrier material from the first to the second surface, and a radiofrequency microcoil is embedded within or in the macroporous carrier material.

As will be described in greater detail hereinafter, the present invention overcomes the deficiencies described above that are associated with the prior art devices and methods and achieves the above object.

Further aspects and features of the exemplary automated safety cap removal mechanism disclosed herein can be appreciated from the appended figures and accompanying written description.

BRIEF DESCRIPTION OF THE DRAWING FIGURES

DETAILED DESCRIPTION OF THE PRESENT INVENTION

Figure 1A:
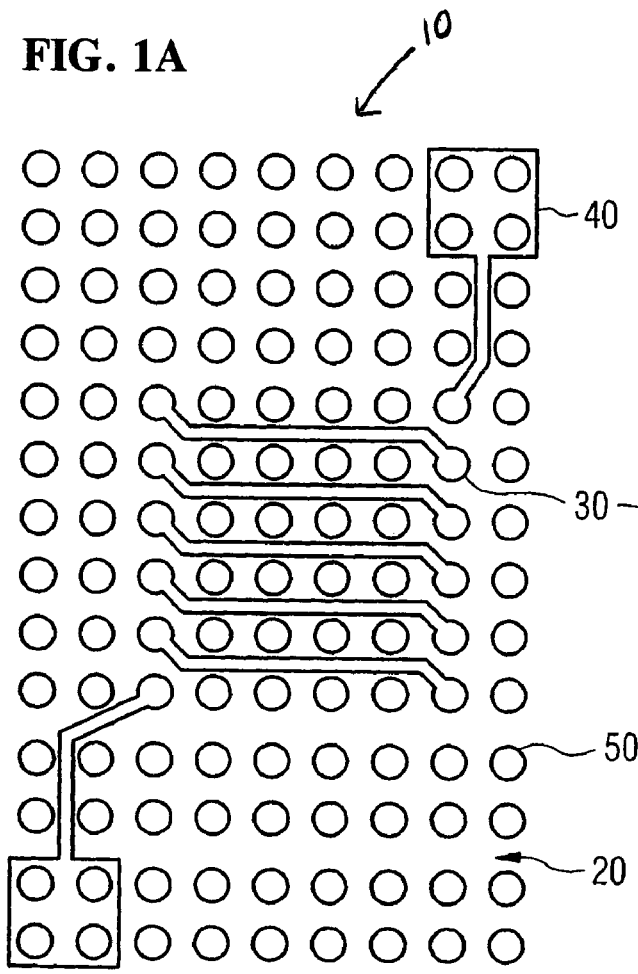
FIG. 1A is a front elevation view of a miniaturized detection coil former according to one embodiment of the present invention.
Figure 1B:
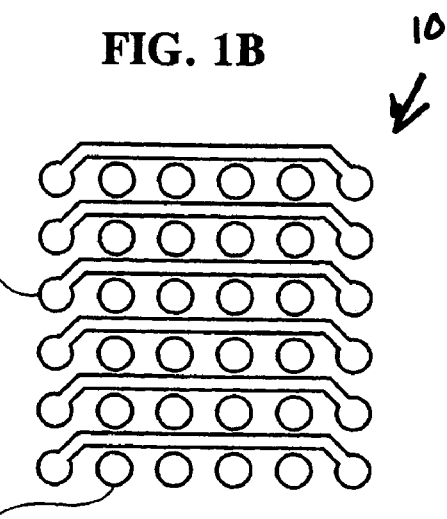
FIG. 1B is a rear elevation view of the miniaturized detection coil former.
Figure 1C:
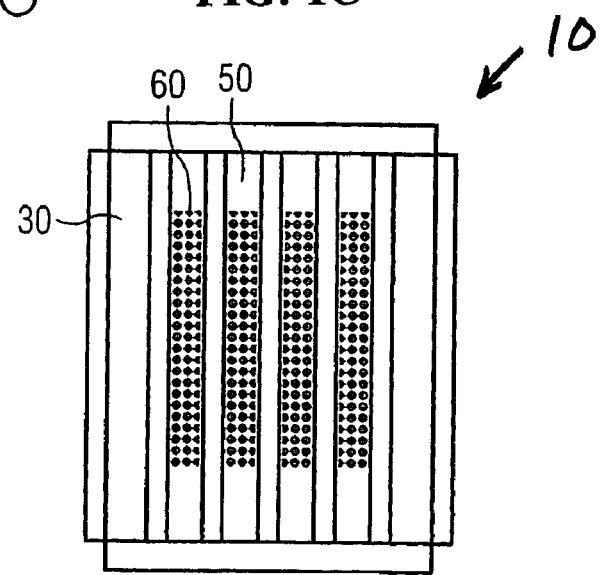
FIG. 1C is a cross-sectional view of the miniaturized detection coil former.

FIGS. 1A-1C show the front side (FIG. 1A) and rear side (FIG. 1B) and also the cross section (FIG. 1C) of a miniaturized detection coil former 10 according to one embodiment of the present invention. The miniaturized detection coil former is constructed from a macroporous carrier material 20 and embedded therein is a microcoil having the coil turns 30 and also bonding pads 40. Macropores 50 are present in the substrate. The cross sectional view of FIG. 1C additionally shows the analyte 60 in the pores.

Figure 2:
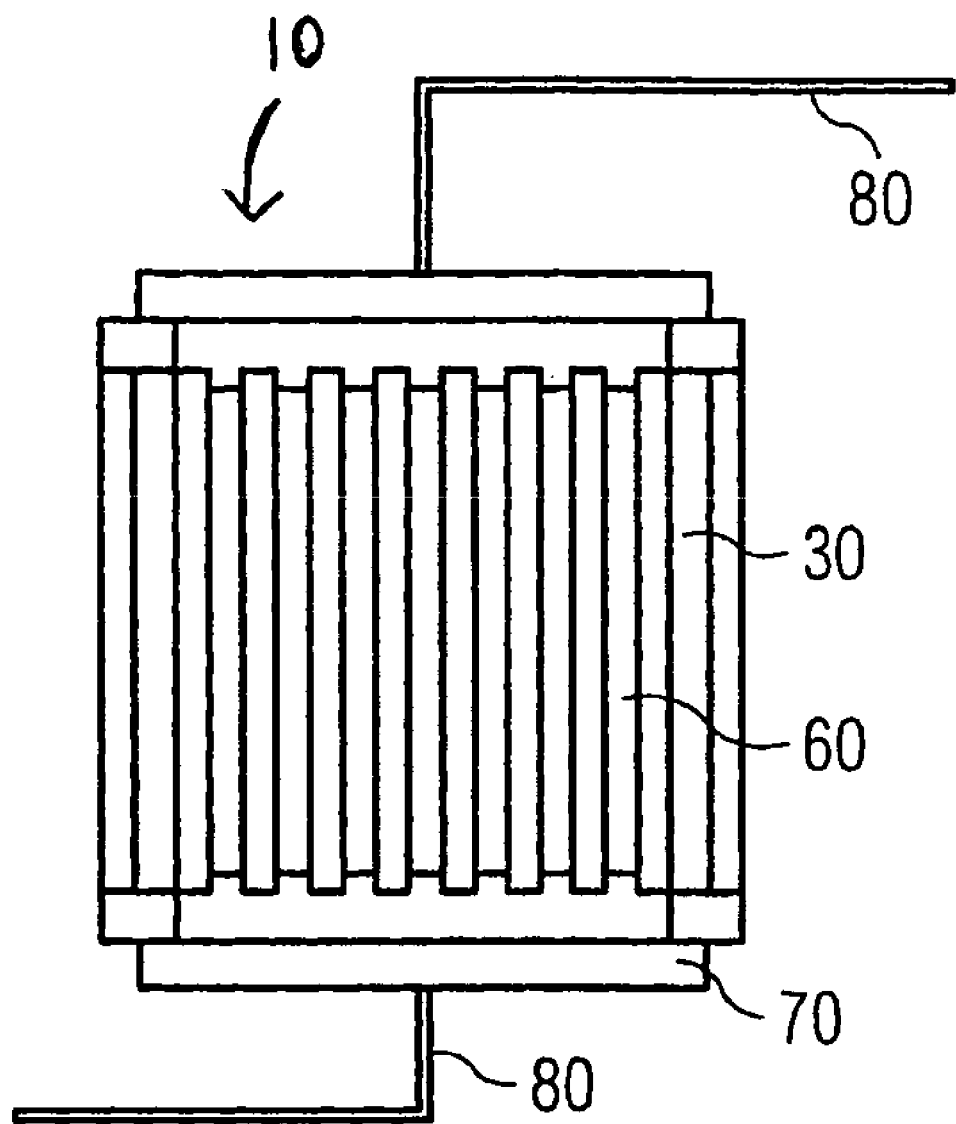
FIG. 2 is a cross-sectional view of the miniaturized detection coil former incorporated into a device for the NMR-spectroscopic analysis of liquid phase samples.

FIG. 2 shows a cross section of a miniaturized detection coil former 10 according to one embodiment of the present invention in a component for the NMR-spectroscopic analysis of liquid phase samples. In this case, the miniaturized detection coil former 10 according to the invention is enclosed in a housing with a fluidic seal 70 and is provided with a feed and discharge line 80 for the analyte. Furthermore, the illustration shows part of the coil 30 in the form of metal-filled pores and also the analyte 60 in the pores.

Figure 3:
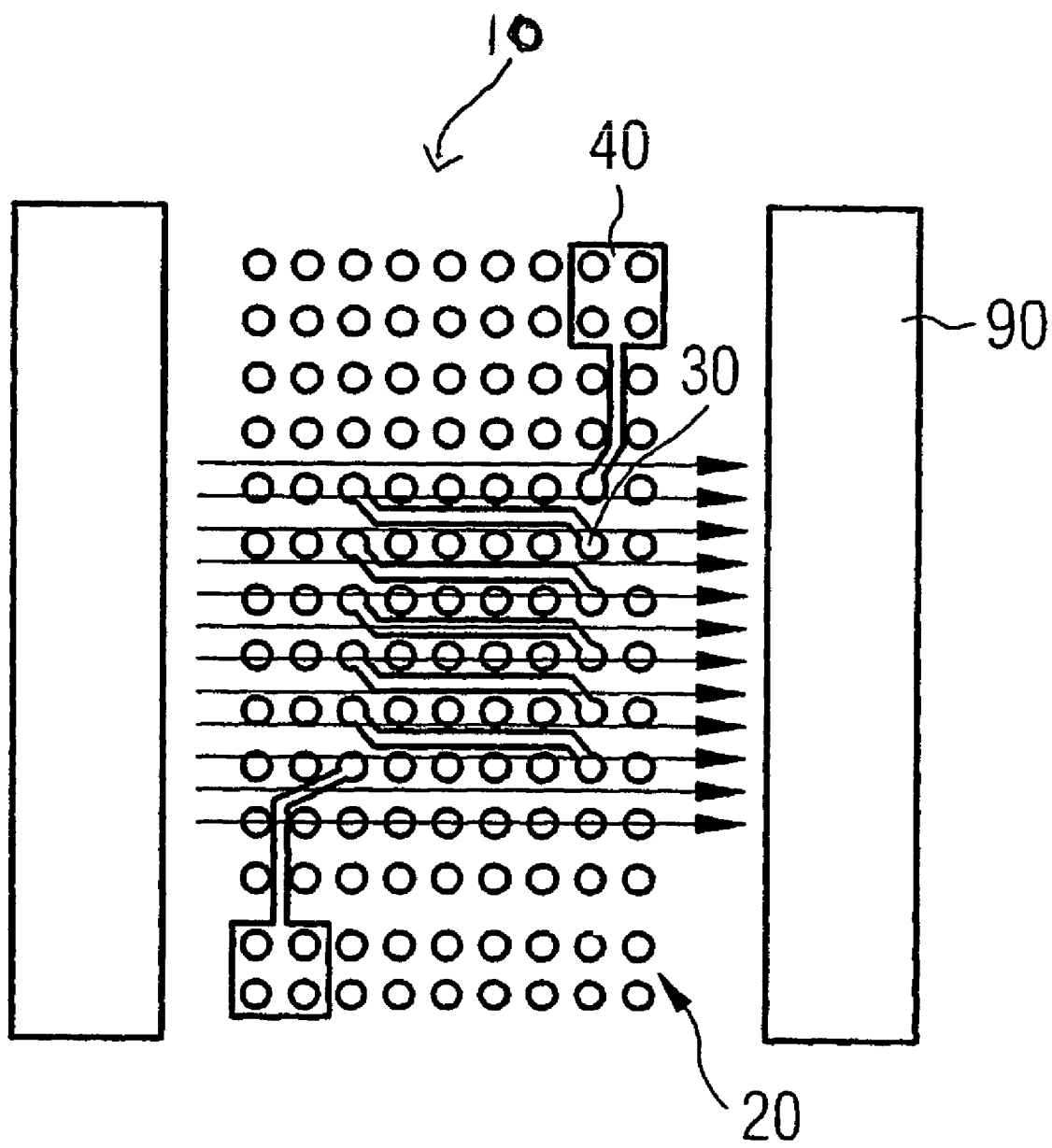
FIG. 3 is a schematic view of the miniaturized detection coil former in a magnetic field of a permanent magnet.

FIG. 3 shows a miniaturized detection coil former 10 according to the invention in the magnetic field ($B_{stat}$) of a permanent magnet 90 or the pole shoes thereof in an NMR measuring device.

According to the present invention, the sensitivity of the NMR-spectroscopic measurement can be improved according to the invention by virtue of the fact that a miniaturized NMR detection coil is embedded in or led through a macroporous substrate through which the analyte is simultaneously led as well. According to the present invention, the macroporous carrier material or substrate serves as a matrix for the coil and simultaneously as a carrier of the analyte. A virtually optimal correspondence between the size of the sample and the size of the NMR detection coil is thereby achieved.

In the context of the present invention, pores are understood both to mean pores which extend through the carrier material from the first to the second surface, that is to say passage holes. Pores which are closed at one end, that is to say blind holes, may, however, also be arranged in regions in the carrier material, in particular in the regions in which no coil turn is present.

With regard to the choice of material, the macroporous carrier material of the present invention is not subject to any restriction as long as it has pores having a pore diameter of 500 nm to 100 µm, preferably 2 to 20 µm. This results in aspect ratios of pore depth to pore opening of greater than 10:1, preferably of greater than 20:1, and more preferably 40:1. The thickness of the macroporous carrier material is usually 100 to 5000 µm, preferably 300 to 600 µm. The distance from pore centre to pore centre (pitch), that is to say between two mutually adjacent or adjoining pores, is usually 1 to 100 µm, preferably 3 to 50 µm. The pore density usually lies in the range of $10^4$ to $10^8/cm^2$.

In particular, the macroporous carrier material used according to one embodiment of the invention can be based on plastic, glass, $Al_2O_3$ or silicon. Macroporous silicon is preferably used as carrier material in the context of the present invention.

In this case, the macroporous silicon preferably used can be doped, preferably n-doped, or undoped. Such a macroporous silicon can be produced for example according to the method described in EP-A1-0 296 348, which is hereby incorporated by reference in its entirety. The hole openings or pores are preferably produced electrochemically, an electrochemical etching being carried out in an electrolyte containing hydrofluoric acid with application of a constant or temporally changing potential, the layer composed of silicon or the substrate being connected as a positively polarized electrode of an electrolysis cell. The production of such holes may be achieved for example in the manner described in V. Lehmann, J. Electrochem. Soc. 140, 1993, page 2836 et seq., which is hereby incorporated by reference in its entirety. In the context of the present invention, however, other semiconductor substrates, such as e.g., GaAs substrates, or glass substrates coated with $Si_3N_4$, can also be provided for example as the macroporous substrate.

In this case, the macropores can for example be configured such that they are essentially round, elliptical or essentially square.

In the case of macroporous silicon as macroporous carrier material, the miniaturized detection coil former according to the invention has an insulation layer made of $SiO_2$ or $Si_3N_4$, which is applied to the essentially complete surface of the macroporous silicon. If the abovementioned insulation layer of the substrate according to the invention is constructed from $SiO_2$, then its thickness is usually from 10 to 100 nm.

Preferably, the pore density of the miniaturized detection coil former is increased in the field region of the coil. In this case, the pore density can be up to $10^{10}/cm^3$.

The embedding of the coil former in the macroporous carrier material used according to the invention results in an NMR RF coil having a cross section of less than 500 µm×500 µm. The minimum distance between the coil turns is limited by the pore spacing or pitch. The expression "coil" or "detection coil former" is used here to refer to a radiofrequency resonator that generates a magnetic field ($B_1$) which is orthogonal with respect to the main magnetic field ($B_0$). The coil is usually configured as a solenoid coil.

The coil may be constructed from any desired material which optimizes the conductive properties of the coil, such as e.g. silver, gold or copper. In one preferred embodiment of the present invention, the coil material of the coil embedded in the macroporous carrier material is based on copper.

A further subject-matter of the present invention relates to a method for producing the miniaturized detection coil former according to one embodiment of the invention, including the steps of:

(i) providing a porous carrier material described as above,
(ii) applying an insulation layer under select conditions,
(iii) depositing an electrically conductive basic metallization layer ("seed layer"),
(iv) patterning of the electrically conductive basic metallization layer ("seed layer") by means of double-sided lithography, and (v) electrodepositing a conductive material suitable for forming an NMR coil, as a result of which the electrodeposited conductive material forms a coil embedded in the macroporous carrier material.

The method according to one embodiment of the invention preferably includes the following steps:
(i) providing a porous carrier material described as above and based on macroporous silicon,
(ii) applying an insulation layer, selected from $SiO_2$ or $Si_3N_4$,
(iii) depositing an electrically conductive basic metallization layer ("seed layer"),
(iv) patterning of the electrically conductive basic metallization layer by means of double-sided lithography, and
(v) electrodepositing copper, wherein the electrodeposited copper forms a coil embedded in the macroporous carrier material.

The application of an insulation layer in step (ii) is generally effected over the entire surface of the macroporous carrier material, that is to say including the entire pore surfaces, for example by means of sputtering techniques or CVD methods. This layer serves, inter alia, for preventing a short circuit between the coil turns. An electrically conductive basic metallization ("seed layer") is subsequently deposited over the whole area on said insulation layer. The electrically conductive basic metallization layer is subsequently patterned according to the desired coil configuration by means of double-sided lithography, that is to say on the front side and rear side, and then serves as a corresponding start layer for the subsequent electroplating in step (v). Such lithography methods for patterning conductive layers are well known to a person skilled in the art. Afterwards, copper, for example, is electrodeposited by making contact with the carrier material, such as e.g. an Si wafer. The deposition is effected selectively only at the locations or regions at which an electrically conductive basic metallization ("seed layer") is present. The deposition of such an electrically conductive basic metallization ("seed layer") may be effected by means of physical vapour deposition methods or chemical deposition (CVD). The material of the electrically conductive basic metallization ("seed layer") is not subject to any specific restriction. Thus, a vapour-deposited copper layer having a thickness of 200 nm, for example, may be used as "seed layer" for example during ECD (electrical copper deposition).

As an alternative, the method according to the invention can include the following steps:
(i) providing a porous carrier material described as above and based on macroporous silicon,
(ii) applying an insulation layer, selected from $SiO_2$ or $Si_3N_4$,
(iii) depositing a precursor layer,
(iv) patterning of the precursor layer by means of double-sided lithography, and
(v) applying a conductive material suitable for forming an NMR coil by means of electroless metallization or electroless plating, wherein the applied conductive material forms a coil.

Step (v) of the method according to the invention involves effecting an electroless or chemical metallization ("electroless plating") of a conductive material suitable for forming an NMR coil from an aqueous electrolyte on the locations or regions of the previously patterned precursor layer. The electrolyte compositions that can be used in step (v) of the method according to the invention are known in principle from the art of surface treatment, corrosion treatment or printed circuit board production. Thus, in the context of the method according to the invention, metals such as, in particular, nickel, copper, platinum, silver and gold and also their alloys, preferably copper, can be deposited in electroless fashion from aqueous solution, that is to say from their metal salts. Such electrolyte compositions are known in the prior art and are used for example for corrosion protection purposes or for producing electrical conductivity on greatly patterned, uneven surfaces for which a metallization in vacuo is not appropriate for method or cost reasons. If there is a chemical potential gradient between the metal salt or the metal cations of the aqueous, metal-cation-containing electrolyte and the material of the previously patterned precursor layer, then the more electronegative metal of the previously patterned precursor layer is oxidized, while the metal cations of the electrolyte are reduced and deposit on the previously patterned precursor layer. The material of the precursor layer is not subject to any specific restriction, but is preferably selected from the group consisting of Pd and Pd—Sn colloids, that is to say seed layers made of palladium or clusters made of Pd—Sn colloids.

The present invention accordingly provides a miniaturized copper coil in a macroporous substrate. In the context of a corresponding NMR measurement method, the analyte is situated in direct proximity to the coil turns, as a result of which an improved signal/noise ratio is obtained. With the arrangement of a passivation layer, such as e.g. made of $SiO_2$ or $Si_3N_4$, by e.g. sputtering or low-temperature CVD, the coil can furthermore be protected against the chemical influences of the analyte (protection of the metal tracks against corrosion). Such a passivation layer may also be polymer-based, e.g. polyparylene.

The miniaturized detection coil former according to the invention is preferably used in the NMR-spectroscopic analysis of a liquid phase sample.

A customary NMR measuring device further includes a permanent magnet and evaluation electronics. Such a construction is well known to a person skilled in the art and therefore is not described in great detail herein. It is possible for example to use NdFeB magnets having a magnetic flux of approximately 1 tesla. Owing to the small sample size made possible by the miniaturized detection coil former according to the invention, the homogeneity requirement made of the static magnetic field can be fulfilled more easily. In the case of a small sample volume, it is advantageous if the analyte is situated in the centre of the coil. On account of the capillary forces in the macroporous substrate, the liquid is drawn into the centre of the pores. This effect can be supported by local application of hydrophobic or hydrophilic layers.

The analyte generally includes a suitable solvent and, contained therein, one or a plurality of chemical compounds to be investigated. Prior to being introduced into the miniaturized detection coil former according to the invention, the sample containing a plurality of components that is to be investigated can be separated into the individual components by means of chromatographic methods such as, for example, liquid chromatography (e.g. HPLC) or else by means of capillary electrophoresis and be introduced successively into the miniaturized detection coil former according to the invention. These components can then be examined by NMR spectroscopy separately from one another in the NMR measuring device. The flow through the miniaturized detection coil former according to the invention can be effected continuously or else in step-by-step fashion. A step-by-step flow means that in each case only a specific volume of the analyte is passed into the miniaturized detection coil former according to the invention, this analyte is examined by NMR spectroscopy and is subsequently replaced by a further sample.

It will be appreciated by persons skilled in the art that the present invention is not limited to the embodiments described thus far with reference to the accompanying drawings; rather the present invention is limited only by the following claims

The invention claimed is:

1. A miniaturized detection coil former for NMR spectroscopy, comprising:
    a macroporous carrier material having a first surface and a second surface situated opposite thereto;
    a multiplicity of discrete pores formed in the carrier material and having a diameter from about 500 nm to about 100 µm, the pores being arranged in a manner distributed over at least one surface region, wherein the pores extend through the carrier material from the first to the second surface; and
    a radiofrequency microcoil being embedded in the macroporous carrier material.

2. The miniaturized detection coil former according to claim 1, wherein the carrier material comprises a macroporous silicon.

3. The miniaturized detection coil former according to claim 2, further including:
    an insulation layer made of one of $SiO_2$ and $Si_3N_4$ and being applied to at least substantially a complete surface of the macroporous silicon.

4. The miniaturized detection coil former according to one of claim 1, wherein the macropores have a diameter in the range of 2 µm to 20 µm.

5. The miniaturized detection coil former according to claim 1, wherein a density of the pores is increased in a field region of the coil.

6. The miniaturized detection coil former according to claim 1, wherein the microcoil is formed of copper.

7. A method for producing the miniaturized detection coil former according to claim 1, comprising the steps of:
    (i) providing the macroporous carrier material;
    (ii) optionally applying an insulation layer;
    (iii) depositing an electrically conductive basic metallization layer;
    (iv) patterning of the electrically conductive basic metallization layer by means of double-sided lithography; and
    (v) electrodepositing a conductive material that is suitable for forming an NMR coil, as a result of which the electrodeposited conductive material forms a coil embedded in the macroporous carrier material.

8. The method according to claim 7, wherein the macroporous carrier material is based on macroporous silicon and the applied insulation layer is selected from one of $SiO_2$ and $Si_3N_4$, the conductive material comprising copper such that the electrodeposited copper forms a coil embedded in the macroporous carrier material.

9. A method for producing the miniaturized detection coil former according to claim 1, comprising the steps of:
    (i) providing a porous carrier material that is based on macroporous silicon;
    (ii) applying an insulation layer that is selected from one of $SiO_2$ and $Si_3N_4$;
    (iii) depositing a precursor layer;
    (iv) patterning of the precursor layer by means of double-sided lithography; and
    (v) applying a conductive material that is suitable for forming an NMR coil by a means selected from the group consisting of electroless metallization and electroless plating, the applied conductive material forming a coil.

10. A system for conducting NMR-spectroscopic analysis of liquid phase samples comprising:
    a housing having a fluidic seal;
    a feed line for receiving an analyte;
    a discharge line for discharging the analyte; and
    a miniaturized detection coil former that includes:
        a macroporous carrier material having a first surface and a second surface situated opposite thereto;
        a multiplicity of discrete pores formed in the carrier material and having a diameter from about 500 nm to about 100 µm, the pores being arranged in a manner distributed over at least one surface region; and
        a radiofrequency microcoil being embedded in the macroporous carrier material;
    wherein the detection coil former is enclosed in the housing by means of the fluidic seal, with the analyte being delivered into pores by means of the feed line.

11. The system according to claim 10, wherein the pores extend completely through the macroporous carrier material.

12. The system according to claim 10, wherein the pores comprise blind holes in that they are closed at one end.

13. The system according to claim 10, wherein the detection coil former is constructed as a solenoid coil.

* * * * *

UNITED STATES PATENT AND TRADEMARK OFFICE
CERTIFICATE OF CORRECTION

| | | |
|---|---|---|
| PATENT NO. | : 7,327,143 B2 | Page 1 of 1 |
| APPLICATION NO. | : 11/361708 | |
| DATED | : February 5, 2008 | |
| INVENTOR(S) | : Alfred Martin | |

It is certified that error appears in the above-identified patent and that said Letters Patent is hereby corrected as shown below:

On the Face of the Patent:

Under Other Publications, line 7, "ing 1998, IEDM '98 Technical Digest, (199), pp. 544-547." should read --ing 1998, IEDM '98 Technical Digest, (1998), pp. 544-547.--

In the Specification:

At column 4, lines 42-50, divide the paragraph to read:

--The embedding of the coil former in the macroporous carrier material used according to the invention results in an NMR RF coil having a cross section of less than 500µm x 500 µm. The minimum distance between the coil turns is limited by the pore spacing or pitch.

The expression "coil" or "detection coil former" is used here to refer to a radiofrequency resonator that generates a magnetic field ($B_1$) which is orthogonal with respect to the main magnetic field ($B_0$). The coil is usually configured as a solenoid coil.--

Signed and Sealed this

Fourteenth Day of October, 2008

JON W. DUDAS
*Director of the United States Patent and Trademark Office*